United States Patent [19]
Blatt

[11] 4,056,736
[45] Nov. 1, 1977

[54] INJECTION LOGIC ARRANGEMENTS
[75] Inventor: Victor Blatt, Northampton, England
[73] Assignee: Plessey Handel und Investments A.G., Zug, Switzerland
[21] Appl. No.: 662,273
[22] Filed: Feb. 27, 1976
[30] Foreign Application Priority Data
  Mar. 11, 1975   United Kingdom ............... 09964/75
[51] Int. Cl.² .................... H03K 3/286; H03K 19/08; H03K 19/20
[52] U.S. Cl. .................... 307/289; 307/207; 307/215; 307/218; 307/247 R; 307/291
[58] Field of Search .......... 307/207, 215, 218, 247 R, 307/289, 291; 328/92, 94, 195, 200, 206

[56] References Cited
U.S. PATENT DOCUMENTS

| 3,321,639 | 5/1967 | Fowler | 307/291 X |
| 3,484,625 | 12/1969 | Booher | 307/289 |
| 3,541,356 | 11/1970 | Lagemann | 307/289 |
| 3,621,289 | 11/1971 | Sasaki | 307/289 X |
| 3,631,269 | 12/1971 | Monahan | 307/291 X |
| 3,812,388 | 5/1974 | Southworth | 307/291 |
| 3,814,953 | 6/1974 | Malaviya | 307/289 |

OTHER PUBLICATIONS

Hart et al., "Integrated Injection Logic", *Phillips Tech. Rev.* 33, pp. 76-85; 1975, No. 3.

*Primary Examiner*—John S. Heyman
*Assistant Examiner*—Larry N. Anagnos
*Attorney, Agent, or Firm*—Fleit & Jacobson

[57] ABSTRACT

A logic flip flop arrangement wherein each of the two outputs of the flip flop has an output gate associated therewith, wherein an input of each of the output gates is connected to an output of a driving gate, and wherein at least one of the output gates has an output thereof combined with an output of that one of the driving gates which is associated with the other output gate to provide a logic function.

8 Claims, 8 Drawing Figures

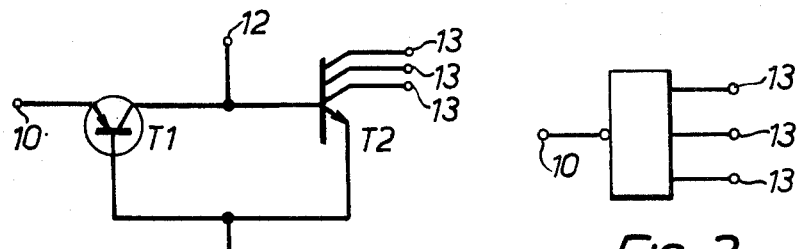
FIG. 1.
FIG. 2.
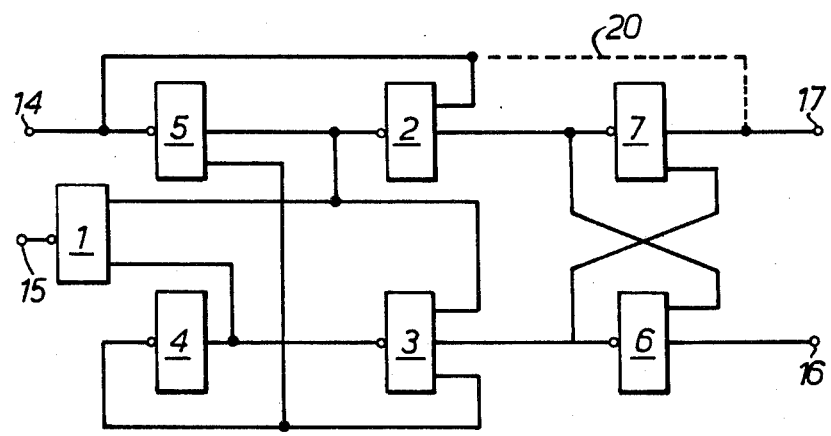
FIG. 3.
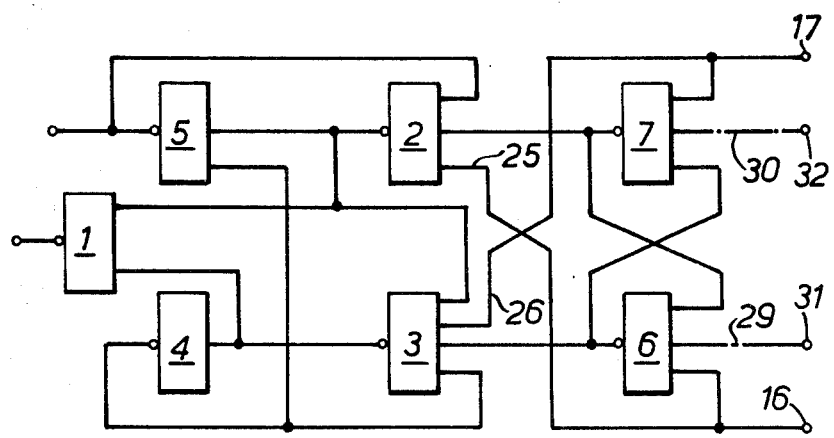
FIG. 4.

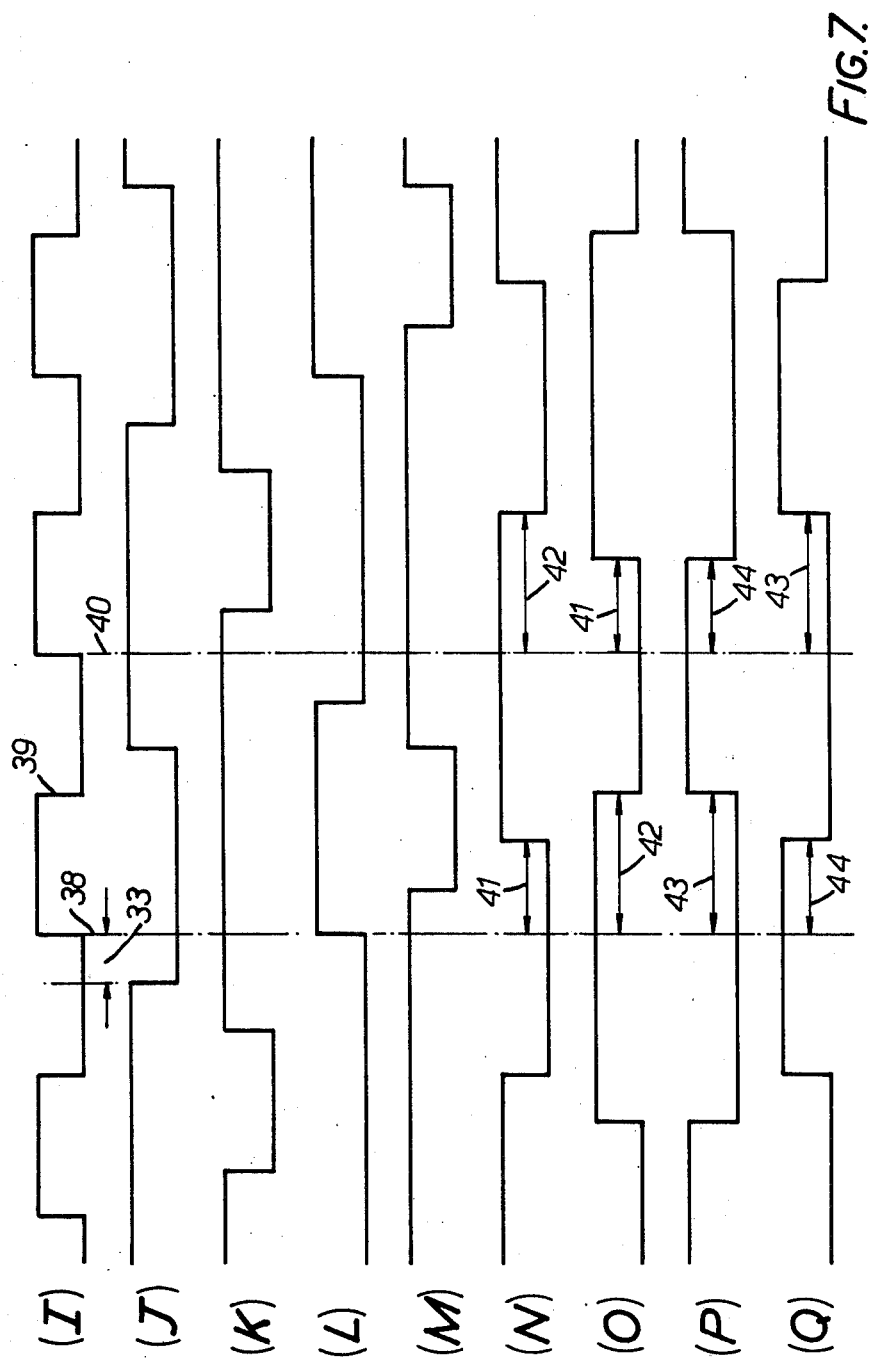

INJECTION LOGIC ARRANGEMENTS

The invention relates to logic flip-flop arrangements and in particular, although not exclusively, to integrated injection logic flip-flop arrangements.

Integrated injection logic (I²L) is known and can be used to realise flip flop configurations. In a conventional edge triggered 'D' type I²L flip flop the propagation delays, i.e., the time lapse between the triggering of the flip flop and the appearance of the positive and negative going outputs, tend to be relatively long and there is a requirement for I²L flip flops with a faster response time than the conventional edge triggered 'D' type I²L flip flop.

A conventional 'D' type I²L flip flop is defined as that type of flip flop wherein a plurality of I²L inversion gates are interconnected, wherein a first gate of the plurality has a first output thereof connected to the input of a second gate of the plurality and to a first output of a third gate of the plurality, a second output thereof connected to the input of the third gate which is also connected to the output of a fourth gate of the plurality, and the input thereof connectable to a source of timing pulses, wherein a fifth gate of the plurality has the input thereof connected to an input terminal and to a first output of the second gate, a first output thereof connected to the input of the second gate and a second output thereof connected to the input of the fourth gate which is also connected to a second output of the third gate, wherein a third output of the third gate is connected to the input of a sixth gate of the plurality and to a first output of a seventh gate of the plurality, wherein a second output of the second gate is connected to the input of the seventh gate and to a first output of the sixth gate, wherein a second output of the sixth gate is connected to a first output terminal and wherein a second output of the seventh gate is connected to a second output terminal.

The invention provides a logic flip flop arrangement wherein each of the two outputs of the flip-flop has an output gate associated therewith, wherein an input of each of the output gates is connected to an output of a driving gate, and wherein at least one of the output gates has an output thereof combined with an output of that one of the driving gates which is associated with the other output gate to provide a logic function. The logic function that is provided can be an AND, a NAND, and OR or a NOR logic function.

The foregoing and other features according to the invention will be better understood from the following description with reference to the accompanying drawings in which:

FIG. 1 illustrates the circuit diagram of an I²L inversion gate,

FIG. 2 illustrates the symbol for the gate of FIG. 1,

Figure 5:
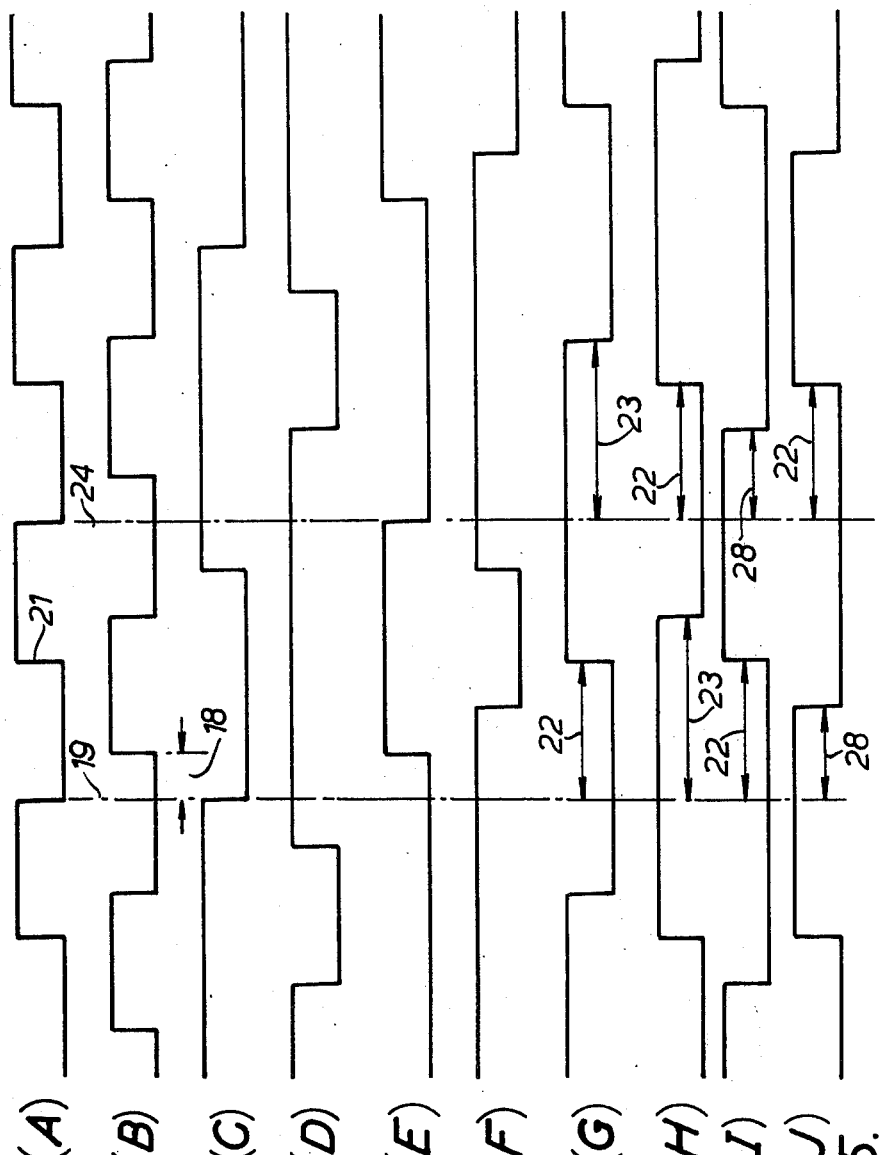
Figure 6:
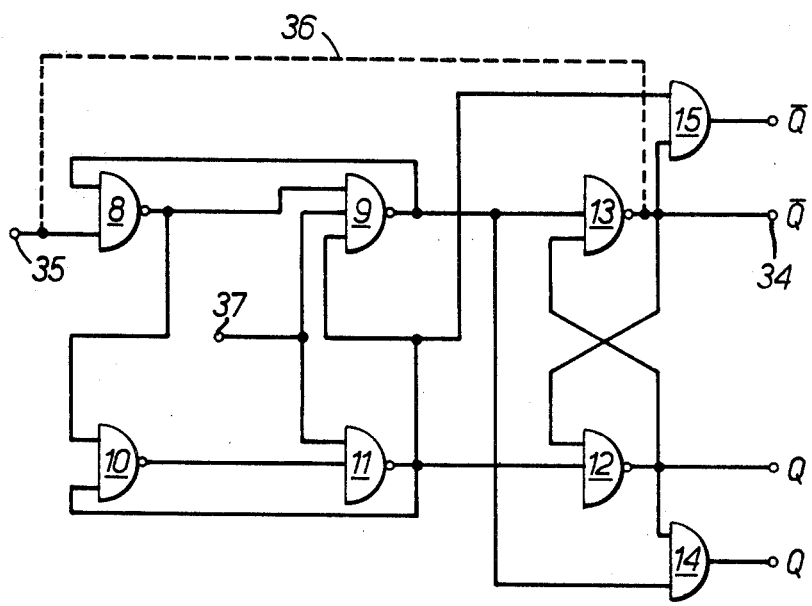
Figure 8:
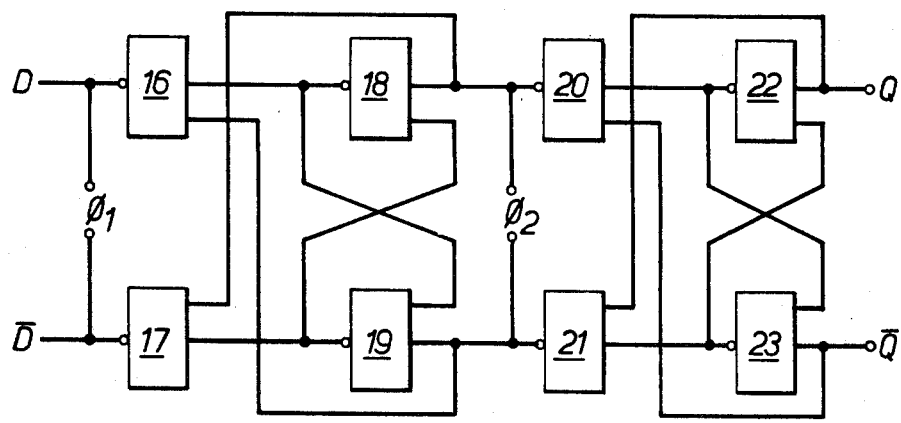

FIG. 3 illustrates a conventional 'D' type I²L flip flop in the form of a block diagram, FIG. 4 illustrates an I²L flip flop arrangement according to the present invention in the form of a block diagram, FIG. 5 illustrates a timing diagram for the flip flop arrangements of FIGS. 3 and 4, FIG. 6 illustrates a 'D' type flip flop arrangement according to the present invention which uses gates having multi-inputs and a single output, FIG. 7 illustrates a timing diagram for the flip flop arrangement of FIG. 6, and FIG. 8 illustrates an I²L master-slave flip flop arrangement according to the present invention.

Integrated injection logic (I²L) is also known as Merged Transistor Logic (MTL) and the circuit diagram of an I²L inversion gate which forms the basis of I²L flip flop arrangements, is illustrated in FIG. 1 of the drawings.

As illustrated in FIG. 1 the gate includes a transistor T1 having the emitter thereof connected to an electrical supply terminal 10, the collector thereof connected to an input terminal 12 and to the base of a multicollector transistor T2 and the base thereof connected to the emitter of the transistor T2 and to a negative supply terminal 12a. The collectors of the transistor T2 are each connected to a separate one of a number of output terminals 13.

The gate of FIG. 1 operates in a known manner to provide at each of the output terminals 13 the inverse of the signal applied to the input terminal 12, the leading edge of each of the output signals being delayed in time with respect to the leading edge of the input signal. This time delay will hereinafter be referred to as a gate delay.

The symbol for the gate of FIG. 1 is illustrated in FIG. 2 and it should be noted that the I²L inversion gate can have any number of outputs, each output being associated with a separate one of the collectors of the transistor T2 of FIG. 1.

The integrated injection logic flip flop hereinbefore defined is illustrated in FIG. 3 of the drawings, the first to seventh gates of the flip flop being indicated respectively by the reference numerals 1 to 7. Each of the gates if of the form illustrated in FIG. 1 and is represented by the symbol of FIG. 2. The input terminal of the gate 5 is indicated by the reference numeral 14, the input terminal of the gate 1 is indicated by the reference numeral 15 and the second output terminals of the gates 6 and 7 are respectively indicated by the reference numerals 16 and 17.

For the purposes of describing the operation of the flip flop of FIG. 1 it will be assumed that the output terminal 17 is connected to the input terminal 14 as shown by the dotted line 20.

The timing diagrams of FIGS. 5(A) to (H) represent the state of the outputs of the gates 1 to 7 of FIG. 3, a single gate delay being indicated by the reference numeral 18. In FIG. 5 the waveform (A) represents the clock pulses, and the wave forms (B) to (H) respectively represent the outputs of the gates 1, 5, 2, 4, 3, 6 and 7.

Thus, when the clock pulses (A) are applied to the terminal 15, the negative going triggering edge 19 of a pulse (A) is applied to the gate 1, i.e., the input of the gate 1 goes low. This will cause, as is illustrated by the waveform (B), the outputs of the gate 1 to go high one gate delay later.

At the time of application of the triggering edge 19 of the pulse (A), the outputs of the gate 5 were, as is illustrated by the waveform (C), also going low as a result of a previous change of state at the output of the gate 2 (see the waveform (D) ). It should, however, be noted that the change of state of the outputs of the gates 1 and 2 need not necessarily occur at the same time, the actual time at which the outputs of the gate 5 change from a high to a low state is dependent on the period of the clock pulses. With the illustrated arrangement the period of the clock pulses is such that the flip flop arrangement is operating at its maximum speed. Thus the change of state of the outputs of the gate 5 would under slower operating conditions occur before the output of the gate 1 changes from a low to a high state.

The change of state of the outputs of the gate 5 causes, as is illustrated by the waveform (E), the output of the gate 4 to go high one gate delay later. Thus with the illustrated arrangement of clock pulses, the outputs of gates 1 and 4 go high at the same time. However, if the clock pulse period is longer than 6 gate delays the outputs of the gates 1 and 4 will not go high at the same time.

The change of state of the outputs of the gates 1 and 4 causes, as is illustrated by the waveform (F), the outputs of the gate 3 to go low one gate delay later.

As a result of the outputs of the gate 3 going low, the outputs of the gate 6 go high (see the waveform (G)) one gate delay later.

The outputs of the gates 2 and 4 are unaffected by the change of state of the output of the gate 3 because they are already in a high state.

As a result of the gate 6 going high, the outputs of the gate 7 will, as is illustrated by the waveform (H), go low.

The positive going triggering edge 21 of the pulse (A) occurs at the same time as the change of state of the output of the gate 6 and this causes, as is illustrated by the waveform (B), the outputs of the gate 1 to go low one gate delay later and at the same time as the gate 7 outputs go low.

As a result of the outputs of the gate 7 going low, the outputs of the gate 5 go high (see the waveform (C)) one gate delay later and as a result of the outputs of the gate 1 going low, the outputs of the gate 3 go high (see the waveform (F)) one gate delay later.

The change of state of the outputs of the gates 3 and 5 causes the outputs of the gate 4 to go low (see the waveform (E)) one gate delay later and this change of state occurs at the same time as the next negative going triggering edge 24 of the pulses (A) is applied to the gate 1.

The outputs of the gate 6 are not affected by the change of state of the gate 3 outputs because the low state of the outputs of the gate 7 prevents the input of the gate 6 from going high.

The triggering edge 24 causes, as is illustrated in FIG. 5, the outputs of the gate 1 to go high one gate delay later and this change of state of the gate 2 outputs causes the outputs of the gate 7 to go high after a further gate delay.

As a result of the outputs of the gate 7 going high, the outputs of the gate 6 will, as is illustrated by the waveform (G), go low.

It can, therefore, be seen from FIG. 5 that a propagation delay 22 from a negative going triggering edge of a clock pulse (A) to the positive going output is of three gate delays and that a propagation delay 23 from a negative going triggering edge of a clock pulse (A) to the negative going output is of four gate delays.

Thus, in the absence of the connection 20, it will take three gate delays after the application of a high input to the terminal 14 before the output at the terminal 16 goes high and four gate delays before the output at the terminal 17 goes low. If the input is low then it will take four gate delays for the output at the terminal 16 to go low and three gate delays for the output at the terminal 17 to go high. All the delays are, as previously stated, measured from the negative going triggering edge of the clock pulses.

With the I²L flip flop arrangement according to the present invention which is illustrated in the form of a block diagram in FIG. 4 of the drawings, the propagation delay for the negative going outputs are reduced from four to two gate delays by combining an output of each of the gates 2 and 6 and by combining an output of each of the gates 3 and 7 to provide AND logic functions.

Thus, the reduction in the propagation delay is effected by providing a third output 25 for the gate 2 and connecting this output to the output terminal 16, and by providing a fourth output 26 for the gate 3 and connecting this output to the output terminal 17.

The timing diagrams of FIG. 5 (I) and (J) respectively represent the waveforms for the outputs of the gates 2 and 6, and the gates 3 and 7 and as shown by these waveforms a propagation delay 28 for the negative going outputs is of two gate delays as measured from the negative going triggering edge of the clock pulses, the outputs 16 and 17 of FIG. 4 respectively following the change of states of the gates 2 and 3.

Thus, in operation, the output of the gate 2 (3) on going low forces the output of the gate 7 (6) to go high which in turn causes the output of the gate 6 (7) to go low. Therefore, whenever, the output of the gate 6 (7) is going low it is because two gate delays previously, the output of the gate 2 (3) went low. It can, therefore, be seen from FIG. 5 (I) and (J) that by interconnecting the gates 2 and 6 (3 and 7) in the manner indicated in FIG. 4, the output of the flip flop arrangement will go low when the output of the driving gate 2 (3) goes low, i.e., only two gate delays after the appearance of the triggering edge of the clock pulse (A) and will be kept in a low state by the gate 6 (7) which is latched with the gate 7 (6).

If the slower propagation delays are also required then the gates 6 and 7 can be respectively provided with further outputs 29 and 30 which would be respectively connected to output terminals 31 and 32.

It should be noted that the I²L flip flop arrangement according to the invention may include any combination of the fast and slow outputs, the particular arrangement that is utilized being dependent on a particular application.

If additional faster outputs are required with any of the aforementioned combinations then this can be achieved by providing the appropriate one of the gates 2 and 3 with a further output for each additional output required, providing the associated one of the gates 6 and 7 with a corresponding number of additional outputs and connecting the or each further output of the gates 2, 3 to a separate one of the additional outputs of the gates 6, 7.

Thus, the gates 2 and 6 and/or the gates 3 and 7 could be provided with one or more fast outputs and, if required, one or more slower outputs could also be provided for at least one of the gates 6 and 7.

The AND logic function that is provided in the I²L flip flop arrangements outlined in preceding paragraphs can also be provided, as is illustrated in FIG. 6 of the drawings, in a 'D' type flip flop arrangement which uses gates having multi-inputs and a single output.

Referring to FIG. 6, the 'D' type flip flop arrangement illustrated therein includes a number of interconnected gates 8 to 15, the gate 8 to 13 being NAND gates which are interconnected in a known manner to provide a conventional 'D' type flip flop arrangement and which each operate in a known manner to provide at the output thereof a high level signal when at least one of the inputs thereof is at a low level, and a low level output signal when all of the inputs thereof are at a high level. The gates 14 and 15 are AND gates and are included to provide the AND logic function previously referred to, i.e., the inputs of the AND gate 14 are connected to the outputs of the NAND gate 9 which is used to drive the NAND gate 13, and the NAND gate 12 whilst the inputs of the AND gate 15 are connected to the outputs of the NAND gate 11 which is used to dirve the NAND gate 12, and the NAND gate 13.

The timing diagrams of FIG. 7 (I) to (Q) represent the state of the outputs of the gates 8 to 15 of FIG. 6, a single gate delay being indicated by the reference numeral 33. In FIG. 7 the waveform (I) represents the clock pulses, and the waveforms (J) to (Q) respectively represent the outputs of the gates 8 to 15.

For the purposes of describing the operation of the flip flop of FIG. 6 it will be assumed that one of its output terminals 34 is connected to its input terminal 35 as shown by the dotted line 36.

Thus when the clock pulses (I) are applied to a terminal 37, the positive going triggering edge 38 of a clock pulse (I) is applied to an input of each of the gates 9 and 11 and at the time of application of the triggering edge 38, the output of the gate 10 is going high (see the waveform (L)) due to the output of the gate 8 which is connected to an input of the gate 10 and to an input of the gate 9, going low one gate delay earlier. Under these conditions, all the inputs to the gate 11 are high, therefore, this gate will, as is illustrated by the waveform (M), go low one gate delay after the application of the triggering edge 38. The output of the gate 9 will, as is illustrated by the waveform (K), remain high because one of the inputs thereof i.e., from the gate 8, is low.

The change of state of the output of the gate 11 causes a low level signal to be applied to an input of the gate 12 and to an input of the gate 15 thereby causing the output of the gate 12 (see the waveform (N)) to go high one gate delay later, and the output of the gate 15 (see the waveform (Q)) to go low one gate delay later.

The change of state of the output of the gate 12 causes a high level signal to be applied to an input of the gate 13 and to an input of the gate 14 thereby causing the output of the gate 13 (see the waveform (O)) to go low one gate delay later and the output of the gate 14 (see the waveform (P)) to go high one gate delay later.

The change of state of the output of the gate 13 which occurs at the same time as a negative going triggering edge 39 of the clock pulse (I), causes the output of the gate 8 (see the waveform (J)) to go high one gate delay later due to the presence, at an input thereof, of the low level output signal of the gate 13. The triggering edge 39 causes, as is illustrated by the waveform (M), the output of the gate 11 to go high one gate delay later.

Thus the outputs of the gates 8 and 11 which go high at the same time, are applied to the inputs of the gate 10 and cause, as is illustrated by the waveform (L), the output of the gate 10 to go high one gate delay later.

The next positive going triggering edge 40 of the clock pulse (I) is applied to an input of each of the gated 9 and 11 and because all the inputs to the gate 9 are high, the output of the gate 9 (see the waveform (K)) is caused to go low one gate delay later. The output of the gate 11 which is low, is not affected because the input applied thereto from the gate 10 is low.

The change of state of the output of the gate 9 therefore causes a low level signal to be applied to an input of each of the gates 8, 13 and 14. The low level signal causes the output of the gate 13 (see the waveform (O)) to go high one gate delay later and the output of the gate 14 (see the waveform (P)) to go low one gate delay later. The output of the gate 8 remains in the high state because both of the inputs to this gate are low.

The low level output signal of the gate 13 is applied to an input of each of the gates 12 and 15, the output of the gate 12 (see the waveform (N)) being caused to go low one gate delay whilst the output of the gate 15 (see the waveform (Q)) is caused to go high one gate delay later.

It can, therefore, be seen from FIG. 7 that with the NAND gates 12 and 13, a propagation delay 41 from a negative going triggering edge of a clock pulse (I) to the positive going output is of two gates delays and a propagation delay 42 from a negative going triggering edge of a clock pulse (I) to the negative going output is of three gate delays. With the AND gates 14 and 15, propagation delays 43 and 44 are provided which are respectively of three and two gate delays from a negative going triggering edge of the clock pulse (I) to respectively the positive and negative going outputs.

It can be seen from the foregoing that there is no net speed gain achieved by using the outputs of the extra gates 14 and 15 but a significant feature of the arrangement of FIG. 6 is that the output of one of the extra gates 14 and 15 always goes low one gate delay before the output of the other gate goes high whilst the outputs of the gates 12 and 13 do the opposite, i.e., one output always goes high one gate delay before the other output goes low.

Thus, the outputs of the gates 12 and 13 can respectively be used with the outputs of the gates 14 and 15 to provide true and inverse outputs which change simultaneously and this mode of operation can be of considerable advantage in certain applications. Also, by using the outputs of the gates 12 and 15 or the outputs of the gates 13 and 14 it is possible to choose whether the minimum of two gate delays is going to be achieved when Q goes high or when Q goes low.

The AND logic funtion which is provided in each of the integrated logic flip flop arrangements outlined in preceding paragraphs by combining an output of the driving gate associated with one of the output gates with an output of the other one of the output gates and/or by combining an output of the driving gate associated with the said other one of the output gates with an output of the said one of the output gates, can also be applied to simple latching circuits, or more complex flip flop arrangements based on latches. For example, the I²L inversion gates 16 to 23 of a known I²L master-slave flip flop arrangement can, as is illustrated in FIG. 8 of the drawings, be interconnected in the specified manner to provide the AND logic function and thereby a fast output which allows the flip flop to be operated at four gate delay clocks instead of the usual six gate delays. The gates 16 and 17 are the driving gates for the output gates 18 and 19 of one part of the circuit and the gates 20 and 21 are the driving gates for the output gates 22 and 23 of the other part of the circuit. The mode of operation and the method by which the four gate delay is achieved will be directly evident from the circuit configuration of FIG. 8 in relation to the described modes of operation of the flip flop circuits of FIGS. 4 and 6 outlined in preceding paragraphs.

Whilst an AND logic function has been outlined in preceding paragraphs for each of the circuit arrangements it should be noted that other logic functions are possible, for example NAND, OR or NOR logic functions. This can be achieved in the flip flop arrangement of FIG. 6 by substituting a NAND, an OR or a NOR gate for either or both of the AND gates 14 and 15, the particular type of gate that is substituted being dependent upon the particular operating requirements of the flip flop arrangement.

It should be noted that further outputs can be obtained with the arrangement of FIG. 6 by providing extra gates of the required type and by connecting the inputs of these gates to the outputs of the gates 11 and 13 and/or the gates 9 and 12.

Whilst the AND logic function has been provided in the I²L logic configurations without the use of further gates, it would be necessary in order to provide a NAND, OR or NOR logic function with these logic configurations to provide extra gates of the required type which would be connected to the appropriate ones of the outputs of the driving and output gates.

The logic flip flop arrangements according to the invention, particularly the I²L arrangements, find application in any logic circuit which utilizes I²L and sequential logic and can in particular be used in a four-decade programmable counter.

In most of the logic flip flop arrangements according to the invention an extra gate is provided in order to realise a desired logic function. However, with I²L logic, an AND logic function can be provided without the use of a further gate. Similarly, other logic techniques, for example, ECL, SFL, DCTL and RTL, could also be used in a logic flip flop arrangement according to the present invention and provide an AND logic function in the specified manner without the use of a further gate.

It is to be understood that the foregoing description of specific examples of this invention is made by way of example only and is not to be considered as a limitation in its scope.

What is claimed is:

1. An integrated injection logic flip flop arrangement comprising
   a. first and second input gates each having first and second independent outputs;
   b. first and second cross-coupled gates each having first and second independent outputs;
   c. means for cross-coupling said first and second cross-coupled gates wherein an input of said first cross-coupled gate is coupled to said first independent output of said second cross-coupled gate, and an input of said second cross-coupled gate is coupled to said first independent output of said first cross-coupled gate;
   d. means for connecting said first independent output of said first input gate to said input of said first cross-coupled gate;
   e. means for connecting said first independent output of said second input gate to said input of said second cross-coupled gate;
   f. first combining means for combining said second independent output of said first input gate with said second independent output of said second cross-coupled gate; and
   g. second combining means for combining said second independent output of said second input gate with said second independent output of said first cross-coupled gate, thus providing two alternative outputs for the flip flop.

2. An integrated injection logic flip flop as claimed in claim 1 wherein said first combining means comprises means for coupling said second independent output of said first input gate and said second independent output of said second cross-coupled gate to a first further gate, and said second combining means comprises means for coupling said second independent output of said second input gate and said second independent output of said first cross-coupled gate to a second further gate.

3. An integrated injection logic flip flop as claimed in claim 2 in which first and second further gates are AND gates.

4. An integrated injection logic flip flop as claimed in claim 2 in which said first and second further gates are NAND gates.

5. An integrated injection logic flip flop as claimed in claim 2 in which said first and second further gates are OR gates.

6. An integrated injection logic flip flop as claimed in claim 2 in which said first and second further gates are NOR gates.

7. A logic circuit comprising an integrated injection logic flip flop, said integrated injection logic flip flop comprising
   a. first and second input gates each having first and second independent outputs;
   b. first and second cross-coupled gates each having first and second independent outputs;
   c. means for cross-coupling said first and second cross-coupling gates wherein an input of said first cross-coupled gate is coupled to said first independent output of said second cross-coupled gate, and an input of said second cross-coupled gate is coupled to said first independent output of said first cross-coupled gate;
   d. means for connecting said first independent output of said first input gate to said input of said first cross-coupled gate;
   e. means for connecting said first independent output of said second input gate to said input of said second cross-coupled gate;
   f. first combining means for combining said second independent output of said first input gate with said second independent output of said second cross-coupled gate; and
   g. second combining means for combining said second independent output of said second input gate with said second independent output of said first cross-coupled gate, thus providing two alternative outputs for the flip flop.

8. A master slave flip flop arrangement in which the master and slave flip flops comprise an integrated injection logic flip flop arrangement comprising
   a. first and second input gates each having first and second independent outputs;
   b. first and second cross-coupled gates each having first and second independent outputs;
   c. means for cross-coupling said first and second cross-coupled gates wherein an input of said first cross-coupled gate is coupled to said first independent output of said second cross-coupled gate, and an input of said second cross-coupled gate is coupled to said first independent output of said first cross-coupled gate;
   d. means for connecting said first independent output of said first input gate to said input of said first cross-coupled gate;

e. means for connecting said first independent output of said second input gate to said input of said second cross-coupled gate;

f. first combining means for combining said second independent output of said first input gate with said second independent output of said second cross-coupled gate; and g. second combining means for combining said second independent output of said second input gate with said second independent output of said first cross-coupled gate, thus providing two alternative outputs for the flip flop.

* * * * *